United States Patent [19]
Gordon

[11] 4,338,482
[45] Jul. 6, 1982

[54] PHOTOVOLTAIC CELL

[75] Inventor: Roy G. Gordon, 22 Highland St., Cambridge, Mass. 02138

[73] Assignee: Roy G. Gordon, Cambridge, Mass.

[21] Appl. No.: 234,646

[22] Filed: Feb. 17, 1981

[51] Int. Cl.$^3$ .............................................. H01L 31/06
[52] U.S. Cl. ...................................... 136/256; 136/255; 136/261; 136/262; 357/30
[58] Field of Search ............... 136/255, 256, 261, 262; 357/30 J; 427/74

[56] References Cited

U.S. PATENT DOCUMENTS 3,952,323  4/1976  Tanimora et al. ..................... 357/15
4,146,657  3/1979  Gordon ................................ 427/126
4,193,821  3/1980  Feng et al. ............................ 148/1.5

OTHER PUBLICATIONS

E. Wang et al., "Determination of Electron Affinity of In$_2$O$_3$ from its Heterojunction Photovoltaic Properties," *J. Electrochem. Soc., vol. 125, pp. 1328–1331 (1978).*

*Primary Examiner*—Aaron Weisstuch
*Attorney, Agent, or Firm*—Robert A. Cesari; John F. McKenna; Andrew F. Kehoe

[57]     ABSTRACT

An improved structure for solar cells is disclosed. It incorporates a layer of titanium dioxide between previously used layers of tin oxide and silicon. The new cells shows increased efficiency and improved thermal stability.

15 Claims, 2 Drawing Figures

PHOTOVOLTAIC CELL

BACKGROUND OF THE INVENTION

This invention relates to solar cells which convert sunlight to electricity, and particularly to solar cells which include layers of tin oxide and silicon in their construction. Such cells have been described in my U.S. Pat. No. 4,146,657, which is incorporated by reference in the present application. In general, this patent disclosed a process for forming fluorine-doped tin oxide layers with such high electrical conductivity that they could be used advantageously as transparent electrodes covering a light-absorbing base material for solar cells made, for example, from silicon. This structure eliminated the need for an expensive and fragile grid of fine metallic lines which serve as an upper electrode in conventional solar cells.

The electrical resistance of these fluorine-doped tin oxide transparent electrodes is satisfactorily and consistently low, when measured with current flowing in the plane of the film. However, current flow between the tin oxide film and the silicon underneath, has been found to be impeded sometimes by an "interfacial resistance" between the two layers. Such interfacial resistance, when present, reduces the overall efficiency of a solar cell.

Another advantageous aspect of the tin oxide layer in these cells is its function as an optical antireflection coating. Bare flat silicon surfaces reflect over one-third of incident sunlight, while a silicon cell coated with tin oxide typically reflects about one-fifth of the incident light. It would clearly be desirable to reduce this 20% reflection loss still further.

SUMMARY OF THE INVENTION

It is a principal object of the present invention to reduce the electrical resistance of a tin oxide-silicon solar cell, and thereby to improve its efficiency.

Another object of the invention is to improve the thermal stability of such solar cells.

Another object of the invention is to reduce further the light reflected from the cell, thereby also improving its efficiency.

Other objects of the invention will be discerned by those skilled in the art on their reading of the present disclosure.

The present invention consists of an improved solar cell design in which a thin layer of titanium dioxide, $TiO_2$, is placed between the tin oxide and the silicon layers. I have discovered that the resulting composite $SnO_2/TiO_2/Si$ structure has significantly improved efficiency and also better thermal stability, compared to the previous $SnO_2/Si$ structures.

The advantages of this new structure arise from a particularly appropriate combination of properties of the materials used. The new structure is more stable, and resists the formation of an insulating layer noted in the previous $SnO_2/Si$ structures. A simpler structure of $TiO_2/Si$ would not be as advantageous as the $SnO_2/TiO_2/Si$ structure, since $TiO_2$ alone does not display sufficiently low electrical sheet resistance, to serve alone as the transparent electrode. However, titanium oxide and tin oxide normally have the same crystal structure, and can bond to each other to form an excellent mechanical and electrical contact. Thus, the composite layer $SnO_2/TiO_2$ combines the best features of each component (high electrical conductivity of $SnO_2$ and superior chemical stability of $TiO_2$) to provide better performance than either compound could individually provide.

Pure titanium dioxide films have a rather high electrical resistance, and would not serve advantageously in the present structures. However, it is known in the art (see, for example, G. H. Johnson, "Influence of Impurities on Electrical Conductivity of Rutile," Journal of the American Ceramic Society, Vol. 36, pages 97–101, 1953) that certain elements such as niobium, tantalum, tungsten, phosphorous, arsenic, antimony and vanadium, can act as dopants serving to decrease the electrical resistance, when they are present as impurities in titanium dioxide. I have also discovered that fluorine can also serve as a dopant increasing the conductivity of titanium dioxide. Thus, the $SnO_2/TiO_2/Si$ structures will be understood to contain sufficient amounts of these or other dopants to provide for the required electrical conductivity.

The new $SnO_2/TiO_2/Si$ structure also reduces the reflection loss from the cell, because the refractive index of $TiO_2$ is intermediate between that of $SnO_2$ and Si. Typically, the addition of a $TiO_2$ layer between the $SnO_2$ and Si layers increases the amount of light entering a solar cell by about four percent. Also, the low electrical resistance of the composite structure reduces the area normally blocked by metallic front electrodes, which typically reflect between 5 and 10% of the light incident on the cell. In addition, a final, top layer of a material of lower refractive index, such as silica, $SiO_2$, (with refractive index optimally equal to the square root of the refractive index of $SnO_2$, or about 1.42) on top of the $SnO_2$ can reduce the reflection loss even further.

IN THE DRAWINGS

Figure 1:
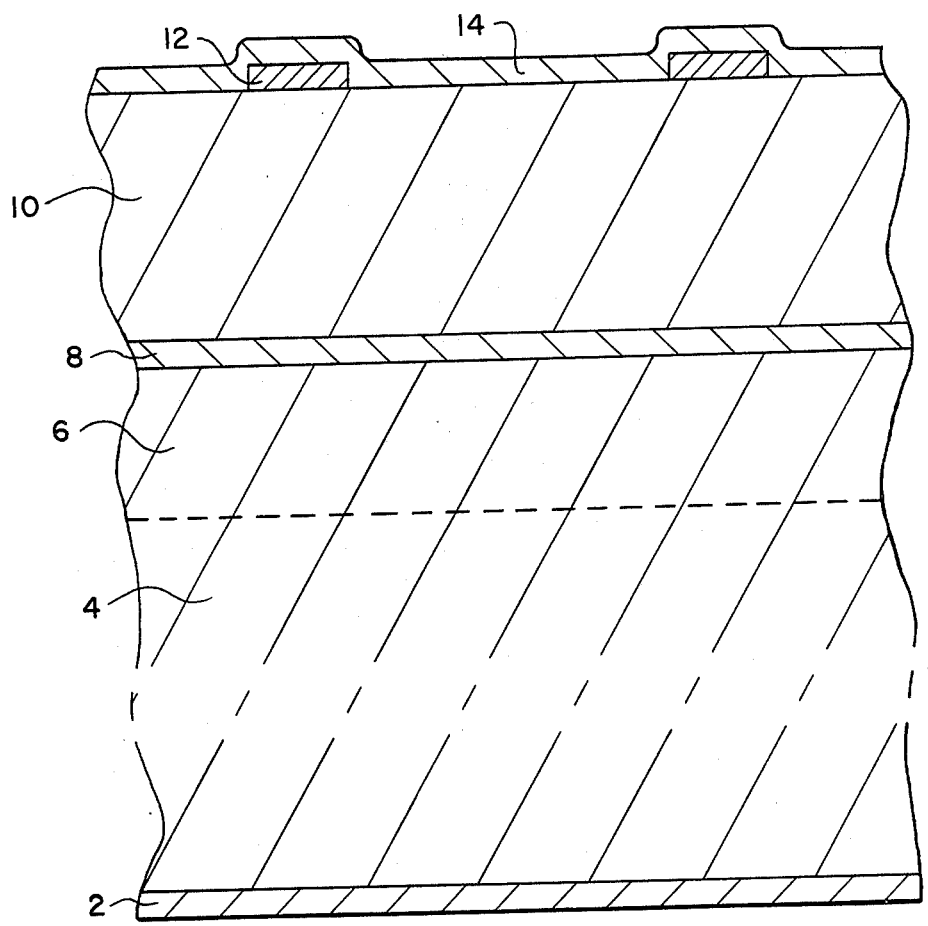
FIG. 1 illustrates, schematically and in section, a solar cell constructed according to the invention.

Referring to FIG. 1, the base photovoltaic layer 4 consists of a crystalline layer of silicon about 200 microns thick. It is doped with boron to be p-type through most of its thickness, except for a thin layer 6 which doped n-type with phosphorus through a thickness of about 0.6 micron. The surface of this n-type layer is heavily doped with phosphorous in order to promote good electrical contact with the titanium dioxide layer 8, which has a thickness about 0.1 micron. This is covered with a fluorinedoped tin oxide layer 10 of a thickness about 1 micron. Metal front contacts 12 of nickel and back electrode 2 of aluminum complete the essential cell structure. An optional antireflection layer 14 of $SiO_2$ about 0.1 micron thick is deposited on top. In an alternative form of the cell, the base layer of silicon 4 is doped n-type with phosphorous, while the top layer of silicon is doped p-type with boron, by methods well-known in the art. In other variations, the silicon layer may be replaced by other suitable semiconductor materials, such as gallium arsenide or indium phosphide.

Figure 2:
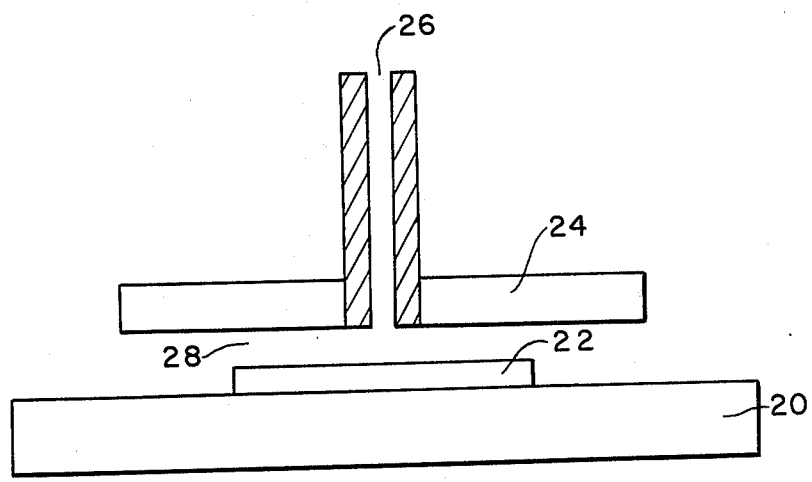
FIG. 2 shows, schematically and in section, an apparatus for forming solar cells according to the invention.

FIG. 2 shows one convenient way to form solar cells with this structure. The silicon layer is first formed and doped by methods which are well-known in the art. Then the titanium dioxide and tin oxide and, optionally silicon dioxide layers are formed by chemical vapor deposition using an apparatus shown schematically in FIG. 2. The bare, doped silicon wafer 22 is placed on a heater 20, above which a gas distributor plate 24 is held.

Suitable reactive vapors are introduced through holes 26, and the gases spread across the space 28 over the silicon, and deposit, in turn, the desired sequence of metal oxide layers of the silicon.

Suitable metal oxide layers may also be deposited by other methods, such as vacuum evaporation, sputtering, or glow discharges, as are well known in the art.

ILLUSTRATIVE EXAMPLES OF THE INVENTION

In this application and accompanying drawings there is shown and described a preferred embodiment of the invention and suggested various alternatives and modifications thereof, but it is to be understood that these are not intended to be exhaustive and that other changes and modifications can be made within the scope of the invention. These suggestions herein are selected and included for the purposes of illustration in order that others skilled in the art will more fully understand the invention and the principles thereof and will be able to modify it and embody it in a variety of forms, each as may be best suited to the condition of a particular case.

EXAMPLE 1

A silicon solar cell blank (n+/p type) is placed on the heater 20 at a temperature of about 520° C. A gas mixture of 4% hydrogen, 2% HF in balance nitrogen carrier gas is passed over the wafer for a few minutes, until the thin silicon dioxide layer normally present on silicon is etched away. The gas mixture is then immediately switched to contain 0.2% titanium (IV) ethoxide Ti-$(OC_2H_5)_4$, 0.02% niobium (V) ethoxide $Nb(OC_2H_5)_5$, 4% hydrogen, balance nitrogen, for about one minute. The gas mixture is formed by injecting a liquid mixture of the titanium (IV) ethoxide and the niobium (V) ethoxide into the hydrogen-nitrogen mixture at about 200° C., using a syringe pump. The gas flow rate is adjusted so that each volume of the reactive gas mixture spends about 0.2 sec in the heated reaction zone. The distributor plate above the gases is held at a temperature of about 250° C. This deposition produced a layer about 0.16 micron thick of titanium dioxide doped with about 10% niobium.

Next, a layer of fluorine-doped tin oxide is formed, by switching the gas mixture to 2.0% tetramethyltin $(CH_3)_4Sn$, 3.0% bromotrifluoromethane $CF_3Br$, balance dry air, for about one minute, which forms a layer about 1 micron thick.

The resulting coated cell has a sheet resistance of about 1 ohm per square on the upper surface. There is negligible interfacial resistance (less than about one ohm per square centimeter) between the metal oxide layer and the silicon, as is demonstrated by the high fill factor when the whole structure is tested as a solar cell. The reflectivity of the coated cell is lower, by about 5 percent, than that of a similar cell without the $TiO_2$ layer.

EXAMPLE 2

Example 1 is repeated, except that tantalum (V) ethoxide is used instead of niobium (V) ethoxide, as the dopant source for the titanium dioxide layer. Similar results are obtained.

EXAMPLE 3

Example 1 is repeated, except that titanium (IV) fluoride is used instead of niobium (V) ethoxide, as the dopant source for the titanium dioxide layer. Similar results are obtained.

EXAMPLES 4-6

Examples 1-3 are repeated with solar cells made of GaAs instead of Si.

EXAMPLES 7-9

Examples 1-3 are repeated with solar cells made of InP instead of Si.

Volatile compounds of vanadium, tungsten, phosphorous, arsenic and antimony also can be used as dopants for the titanium dioxide layer. Interfacial resistances achieved thus far with these dopants have been higher than with fluorine, niobium, and tantalum, which are therefore preferred.

A further reduction in reflection from these cells is obtained by a final coat of silica, according to procedures known in the semiconductor industry, or described in my U.S. Pat. Nos. 4,187,336 and 4,206,252.

It is also to be understood that the following claims are intended to cover all of the generic and specific features of the invention herein described and all statements of the scope of the invention which might be said to fall therebetween.

What is claimed is:

1. In a photovoltaic cell structure containing a transparent, electrically conductive metal oxide layer overlying a light-absorbing semiconductive photovoltaic layer, the improvement wherein a transparent, electrically conductive layer of titanium dioxide is between said metal oxide layer and said photovoltaic layer.

2. A structure as defined in claim 1, wherein said metal oxide layer is composed of an oxide of tin, indium, cadmium, zinc, or a mixture thereof.

3. A structure as defined in claim 2, wherein said metal oxide layer is composed of fluorine-doped tin oxide.

4. A structure as defined in claim 1, wherein said photovoltaic layer is composed of silicon, gallium arsenide, or indium phosphide.

5. A structure as defined in claim 4, wherein said photovoltaic layer is composed essentially of silicon.

6. A structure as defined in claim 1, wherein said layer of titanium dioxide is doped with fluorine, niobium, tantalum, tungsten, phosphorous, arsenic, antimony or vanadium, or mixtures thereof.

7. A structure as defined in claim 6, wherein said layer of titanium dioxide is doped with fluorine, niobium or tantalum.

8. A structure as in claim 1, wherein said layer of titanium dioxide has a sufficiently high electrical conductivity so that it contributes less than one ohm to the internal resistance of a solar cell of one square centimeter area.

9. A structure as in claim 1, wherein the electrical resistance of the cell is reduced by the presence of the titanium dioxide layer.

10. A structure as in claim 1, wherein the thermal stability of the cell is increased by the presence of the titanium dioxide layer.

11. A structure as in claim 1, wherein the reflectivity of the cell to light is reduced by the presence of the titanium dioxide layer.

12. A process of making an improved silicon photovoltaic cell comprising the step of placing a doped, electrically conductive, titanium oxide film on a photovoltaic silicon substrate and then overcoating said titanium oxide film with a thin, electroconductive layer of tin oxide.

13. A process as defined in claim 12 comprising the further step of decreasing the reflectivity of sunlight from said cell by overcoating said tin oxide with a transparent metal oxide of lower refractive index.

14. A process as defined in claim 13 wherein said refractive index of said metal oxide is about 1.4.

15. A process of operating a silicon-type solar cell to achieve enhanced light-receiving efficiency comprising the steps of (1) providing, between a photovoltaic silicon material and incident radiation, a transparent electroconductive structure which is free of metallic conductor members, and (2) separating said silicon material from an overlying electroconductive $SnO_2$ layer by a thin layer of electroconductive titanium oxide, and (3) providing a thin layer of a relatively low refractive index material over said electroconductive $SnO_2$ as means to further reduce reflectivity of said cell.

* * * * *